United States Patent
Rickers

(10) Patent No.: US 9,807,834 B2
(45) Date of Patent: Oct. 31, 2017

(54) LOAD DEVICE, DRIVER FOR DRIVING THE LOAD, AND DRIVING METHOD

(71) Applicant: OLEDWORKS GMBH, Aachen (DE)

(72) Inventor: Christoph Rickers, Wendhausen (DE)

(73) Assignee: OLEDWORKS GMBH, Aachen (DE)

( * ) Notice: Subject to any disclaimer, the term of this patent is extended or adjusted under 35 U.S.C. 154(b) by 0 days.

(21) Appl. No.: 15/109,722

(22) PCT Filed: Dec. 19, 2014

(86) PCT No.: PCT/EP2014/078612
§ 371 (c)(1),
(2) Date: Jul. 5, 2016

(87) PCT Pub. No.: WO2015/101514
PCT Pub. Date: Jul. 9, 2015

(65) Prior Publication Data
US 2016/0338162 A1    Nov. 17, 2016

(30) Foreign Application Priority Data

Jan. 6, 2014 (EP) .................................... 14150186

(51) Int. Cl.
| | | |
|---|---|---|
| H05B 37/02 | (2006.01) | |
| H05B 33/08 | (2006.01) | |
| H05B 37/03 | (2006.01) | |
| H05K 1/02 | (2006.01) | |
| H05K 1/11 | (2006.01) | |

(52) U.S. Cl.
CPC ..... *H05B 33/0845* (2013.01); *H05B 33/0884* (2013.01); *H05B 33/0896* (2013.01); *H05B 37/03* (2013.01); *H05K 1/0296* (2013.01); *H05K 1/111* (2013.01); *H05K 2201/10106* (2013.01)

(58) Field of Classification Search
CPC ............ H05B 33/0896; H05B 33/0848; H01L 23/544; H01L 33/38; H01L 51/52; H01L 51/5209; H01L 51/5225; H01L 2223/54413; H01L 2223/54493
USPC .................................. 315/307, 151; 345/690
See application file for complete search history.

(56) References Cited

U.S. PATENT DOCUMENTS

| | | | | |
|---|---|---|---|---|
| 8,508,136 B2* | 8/2013 | Hente | ................ | H05B 33/0896 315/133 |
| 2011/0187285 A1* | 8/2011 | Hente | ................ | H05B 33/0896 315/294 |
| 2013/0082997 A1* | 4/2013 | Wurzel | ............... | G06F 11/3044 345/211 |

FOREIGN PATENT DOCUMENTS

| | | |
|---|---|---|
| EP | 966183 A1 | 12/1999 |
| WO | 01/45471 A1 | 6/2001 |

OTHER PUBLICATIONS

International Search Report and Written Opinion issued in PCT/EP2014/078612 on Apr. 9, 2015, 8 pages.

* cited by examiner

*Primary Examiner* — Daniel D Chang

(57) ABSTRACT

A device and associated PCB structure are provided in which a dedicated area of the device substrate is patterned, so that it can be contacted by a readout arrangement of the PCB. The pattern comprises an arrangement of contact regions. Interconnections and open circuits are used to encode information. A dotted contact area of the PCB is used to probe the pattern, and relay this to a driver which can then derive information about the type of device being driven. The driver can thus be controlled accordingly.

16 Claims, 5 Drawing Sheets

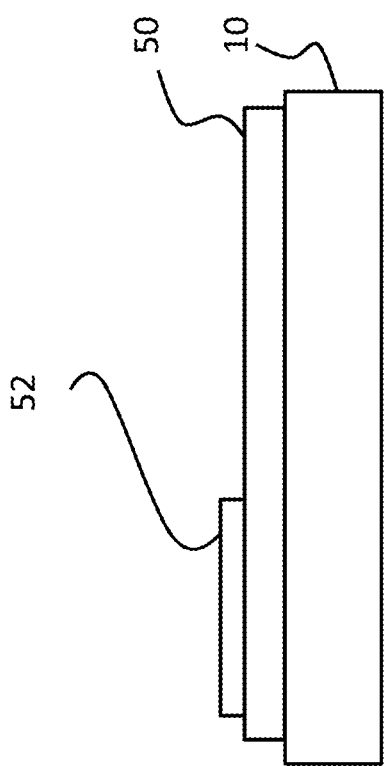

LOAD DEVICE, DRIVER FOR DRIVING THE LOAD, AND DRIVING METHOD

FIELD OF THE INVENTION

This invention relates to a driver circuit, and in particular one which can recognise the type of load to which it is connected, and to a load device which provides information about its characteristics to enable a driver to be controlled accordingly. The invention also relates to driving methods.

BACKGROUND OF THE INVENTION

One example of driver and load is an LED and its associated driver. In this description and claims, the term "LED" will be used to denote both organic and inorganic LEDs, and the invention can be applied to both categories as well as to non-lighting applications. The detailed examples below are based on OLEDs but all examples can use inorganic LEDs instead.

LEDs are current driven lighting units. They are driven using an LED driver which delivers a desired current to the LED.

The required current to be supplied varies for different lighting units, and for different configurations of lighting unit. The latest LED drivers are designed to have sufficient flexibility that they can be used for a wide range of different lighting units, and for a range of numbers of lighting units.

To enable this flexibility, it is known for the driver to operate within a so-called "operating window". An operating window defines a relationship between the output voltage and output current than can be delivered by the driver. Providing the requirements of a particular lighting load fall within this operating window, the driver is able to be configured for use with that particular lighting load, giving the desired driver flexibility.

The driver has its output current set to the desired level within its operating window. This can be achieved by programming the driver to deliver a specific current or by providing current setting information using an input to the driver. This input can be connected to a setting resistor or other component, outside the driver, which is read by the driver. The value of the current setting resistor or other component is measured by the driver, which can then configure its output accordingly, so that the output current is determined by the resistance value. The important point is that after the driver has been produced, the output current can be selected, so that a single driver design is suitable for a range of output currents.

Once the current has been set, the voltage delivered by the driver will vary depending on the load presented to it (since the LEDs are current driven), but the driver will maintain this voltage within the operating window.

There is a particular need for a flexible driver because OLED technology is quite new and developing fast. Times between innovation of new materials and OLED architectures to give improved performance data (lumen, brightness, efficiency, size, . . . ) are very short, for example compared to typical support periods for products using the OLEDs. This support period is typically in the range of multiple years. Driver electronics also develops quickly to keep up with the demands of the new devices, particularly as driver architectures from historical LED technology cannot be simply copied to support OLEDs as well.

Although lifetime and reliability of OLEDs is also continuously improving, failed products have to be replaced. The required performance of typical devices requires the implementation of multiple OLEDs per luminaire. There is a need to be able to exchange one OLED within such a device, and to then use an updated OLED device design. For example, it is desired not to produce old device architectures longer than required, so that all production time can be allocated to state of the art devices.

One way to support older OLEDs with newer drivers or drive newer OLEDs in applications equipped also with older devices is to provide a flexible driver which knows how to drive the OLED appropriately (reduced current, dedicated dimming levels, colour point corrected . . . ), and this is enabled by the current setting resistor (or capacitor) as mentioned above. These components can be provided on a PCB attached to the OLED.

A drawback of this approach is that everything added to the back of the OLED contributes to the overall thickness of the luminaire/module.

SUMMARY OF THE INVENTION

The invention is defined by the claims.

According to the invention, there is provided a device for connection to a device driver, comprising:

a substrate;

a patterned area of the substrate, comprising a set of device contact regions, wherein a network of interconnections is provided between the device contact regions, which network encodes information concerning the characteristics of the device.

This device encodes relevant data concerning the characteristics of the device into the substrate design. Contact regions (such as contact pads) are used to encode this data, instead of additional active or passive components. In this way, the total thickness of the device does not need to be increased. The patterned area of the substrate can be connected to a PCB (for example by electrically conductive glue, or using an anisotropic conductive film) so that the coded information can be provided to the PCB without additional overall height of the system. A device driver can then communicate with the PCB to obtain the device characteristics.

The encoding approach of the invention can be implemented with low cost, for example avoiding the need for optical read out of information or use of additional components. The contact regions can be provided simply as a modification to an already required patterning step.

The device can comprise an LED device, having a set of layers defining an active light emitting area of the device.

The patterned area can comprise a set of pairs of device contact regions, wherein a short between a pair encodes one binary value and an open circuit between a pair encodes an opposite binary value. In this way, a string of pairs of contacts encodes a binary word or series of binary words. The more contact pads are used, the more binary bits can be encoded. This provides a simplest way to encode the information required. The pairs can be aligned so that there is only one row of contact regions.

An open circuit between a pair of device contact pads can be formed as a patterned area which previously defined a short circuit. This means the substrate can be a standard design with all contacts regions interconnected by a conductive area, and it can then be adapted to the particular LED structure being applied to the substrate by patterning to create the required set of connections. This patterning can be performed by laser ablation or by etching.

For lighting applications, the network preferably encodes information concerning the desired driving voltage or a required dimming level. Any other information can be coded, such as the lighting area, and parameters for the correct driver setting to individually drive red, green and blue (or other) units, The device can further comprise a PCB which connects to the patterned area of the substrate, the PCB having a set of PCB contact pads for connection to the device contact regions. The PCB is used as an interface to enable sensing of the connections between the device contact regions. The PCB then communicates with a driver which can carry out the required testing.

The invention thus also provides an electronic apparatus comprising a device of the invention and a driver comprising a connection part for interfacing with the PCB of the device, wherein the driver comprises testing circuitry for testing short circuits between the PCB contact pads, thereby to enable the network of interconnections between the device contact regions to be determined caused by the connection of the PCB contact pads to the device contact regions.

The testing circuitry is thus part of the driver, so that the components which need to be carried by the PCB are kept to a minimum. The PCB acts as an interface between the driver and the substrate of the device.

The apparatus can comprise an LED lighting apparatus and the device comprises an LED device. The driver can then be adapted to drive the LED device in dependence on the information concerning the characteristics of the LED device as determined by the testing circuitry.

The invention also provides a method of driving a device, comprising:

testing for interconnections between a set of device contact regions on a substrate of the device, thereby to determine a network of interconnections provided between the device contact regions, which network encodes information concerning the characteristics of the device; and driving the device using a driver which is controlled in dependence on the encoded information.

BRIEF DESCRIPTION OF THE DRAWINGS

Examples of the invention will now be described in detail with reference to the accompanying drawings, in which:

FIG. 5 shows a second example of a substrate and PCB of an LED arrangement in accordance with the invention, in schematic form.

DETAILED DESCRIPTION OF THE EMBODIMENTS

The invention provides a device and associated PCB in which a dedicated area of the device substrate is patterned, so that it can be contacted by a readout arrangement of the PCB. The pattern comprises an arrangement of contact regions. Interconnections and open circuits are used to encode information. A dotted contact area of the PCB is used to probe the pattern, and relay this to a driver which can then derive information about the type of device being driven. The driver can thus be controlled accordingly. For the preferred application to lighting devices, the pattern can encode information such as driving voltage, dimming levels, size, shape, colour point, single or tunable LED etc.

Figure 1:
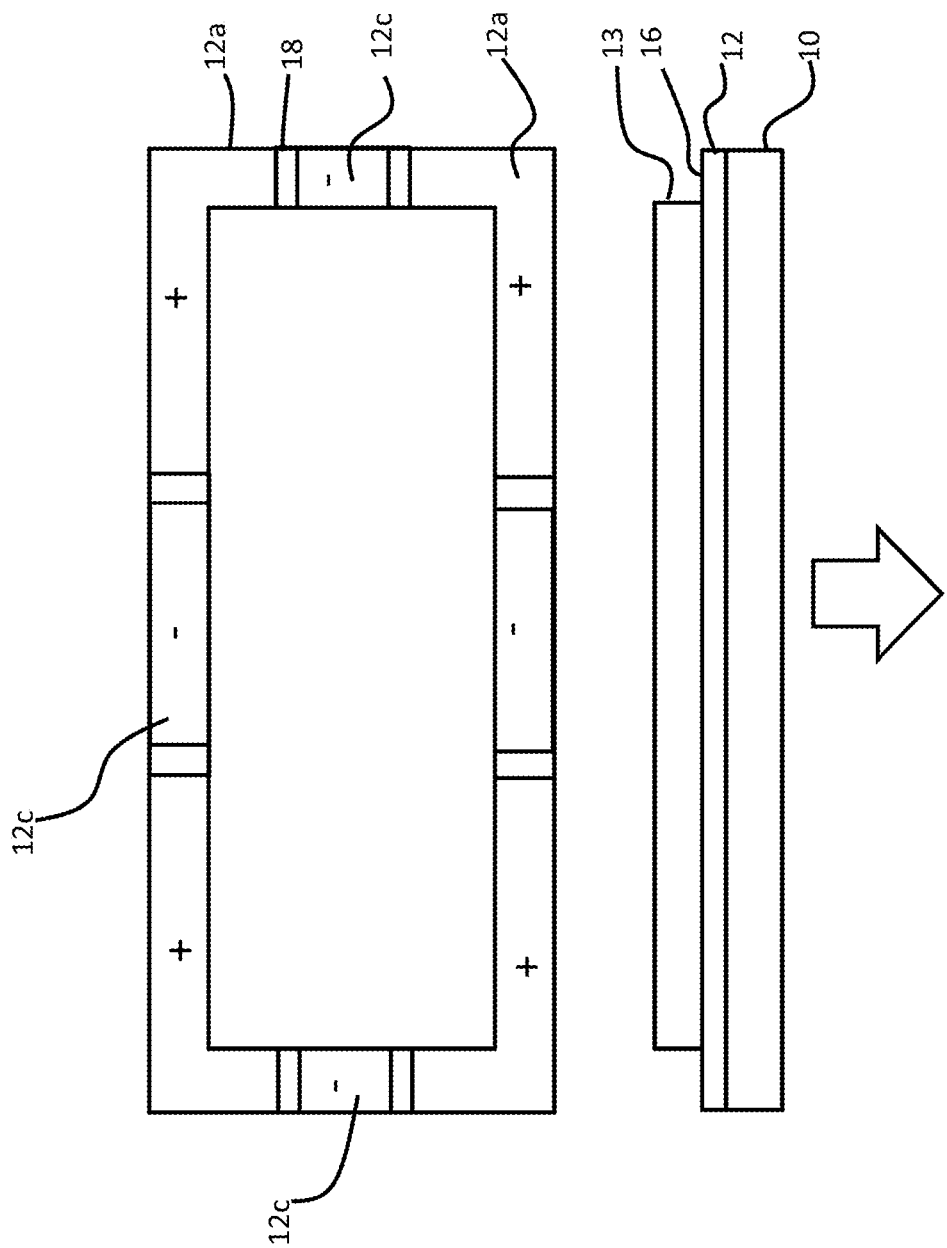
FIG. 1 shows an example of an OLED device.

FIG. 1 shows in simplified schematic form an example of OLED device to which the invention can be applied.

The OLED comprises a substrate 10 and a transparent conductive layer 12 over the substrate (transparent because this example is a bottom emitting structure). An encapsulated OLED structure is provided over the contact layer 12, represented by the layer 13. The OLED layers are much thinner than the substrate, so are not shown in FIG. 1. An outer ledge 16 of the contact layer 12 extends laterally beyond an outer edge of the encapsulated OLED structure.

The OLED structure has multiple anode and cathode contacts, and these connect to different contact regions of the contact layer 12 in the ledge area to form contact areas for the cathode and anode layers of the OLED structure. The plan view in FIG. 1 shows four cathode contact regions 12c, one at the centre of each edge of the OLED structure, and four anode contact regions 12a at the four corners. Separation gaps 18 are provided.

FIG. 1 shows a bottom emitting OLED structure, with light emitted through the substrate. For this reason, the contact layer 16 is transparent, and can for example comprise ITO, ZnO:Al, or other transparent conductors, typically materials from the group of transparent conductive oxides (TCOs). New technologies such as carbon nanotubes or layer sequences can also be used. The relatively high resistance of some transparent conductors, such as ITO, means that electrical connections with better conductivity are desired to distribute the current along the contact ledges to the anode contact regions and the cathode contact regions.

For this purpose, a PCB in a frame shape can be mounted over the contact ledge 16.

Other approaches for forming contacts and to improve lateral current injection are available such as a bonded anisotropic conductive film ("ACF") or glued metal wires. These present a simpler and cheaper alternative to a PCB. In this case, a smaller PCB can provide the pattern interface function of the invention and does not need to provide interconnections between anode regions and between cathode regions. Thus, different technologies can be used to provide electrical contacts to power the OLED and to provide pattern interface function.

The structure of the OLED device can be conventional. A typical OLED according to the state of the art consists of active organic layers, a cathode, an anode, and a substrate. The active organic layers consist of a hole transport layer and a light emitting polymer for a polymer-based OLED (known as PolyLeds). The small-molecule version of an OLED (known as SmOLEDs) consists of some additional layers: hole injecting, emitting, hole blocking and electron transport layers. Furthermore functional layers like CGL (charge generation layers) can also be included. The manufacture of the OLED can be based on printed or evaporated OLEDs but also other/future techniques like liquid processing can be used.

The OLED active layers are mounted on a substrate which may be coated with, for instance, indium tin oxide (ITO), thereby forming an ITO layer typically of about 150 nm to function as a hole-injecting electrode. The cathode applied on top of the organic layers which provides electron injection is of the order of 100 nm thick.

The OLED layer stack 11 is provided between the contact layer 12 and an encapsulation 22 (these together are represented as the single layer 13 in FIG. 1). The contact layer 12 can function as the anode, and the layer stack comprises the organic layers and a top cathode metal. The substrate 10 is the substrate for the OLED stack. The substrate can be glass for rigid devices or it may be plastic (typically with a barrier layer) for example for flexible devices.

The encapsulation overlaps the edge of the OLED layers 11 but terminates before the contact ledge 16, whereas the contact layer 12 extends fully to the outer edge so that the PCB 20 can connect to the contact regions. The cathode layer can be sufficiently conductive to provide homogeneous devices. However, a metal foil 14 may also be provided over the top for heat distribution/dissipation and mechanical protection of the thin film encapsulation. An adhesive layer 15 bonds the metal foil (if present) to the encapsulation 22.

As one example only, the ledge width can be of the order of 3 mm, the overall device thickness can be approximately 1 mm to 3 mm based on a substrate thickness typically in the range 0.7 to 2.0 mm. The overall panel size can have typical linear dimensions in the range 5 cm to 30 cm, although larger or smaller devices are possible.

Figure 2:
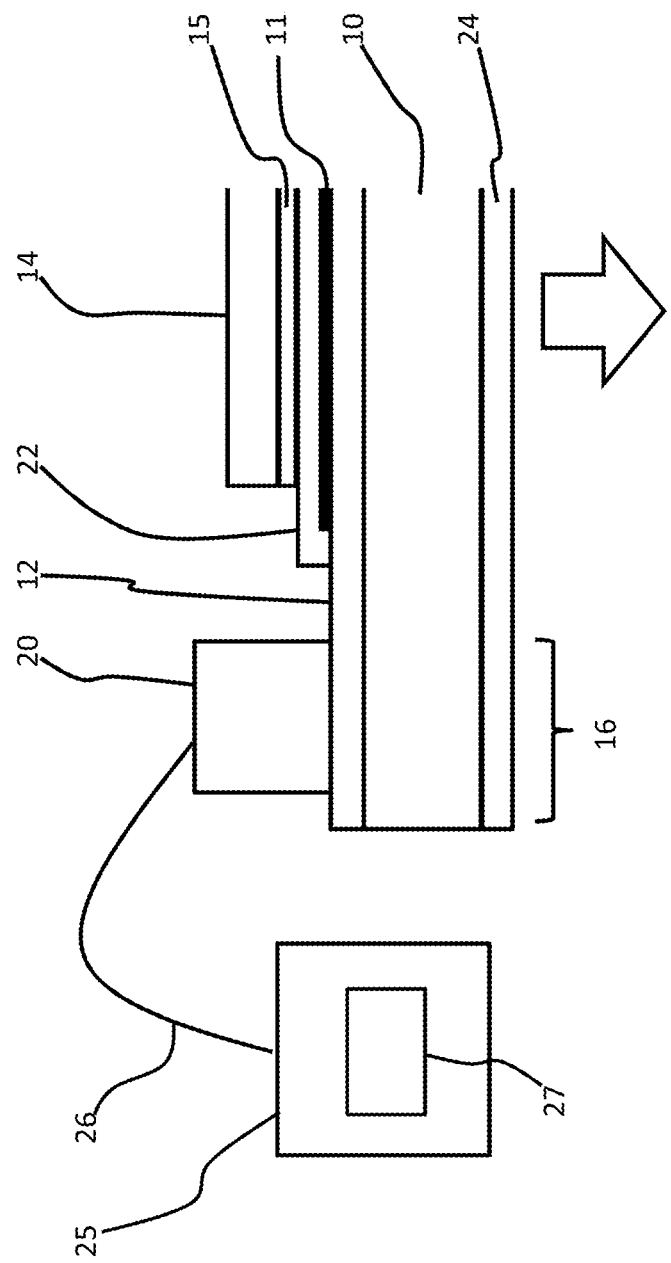
FIG. 2 shows how a PCB can be mounted on the OLED device ledge.

FIG. 2 shows a PCB 20 mounted over the ledge 16, and shows the layers in more detail. The PCB 20 is glued to the OLED and hence is part of the module which is generally sold separately from the driver electronics. The PCB is not removable from the device substrate. The driver electronics is then wired to the PCB.

FIG. 2 shows schematically the driver 25 coupled to the PCB 20 by a flat cable 26, although a plug and socket can be used. This interconnection between the LED-PCB module and the driver can be located at a different place to the OLED unit itself, for example set aside in a luminaire housing or in a piece of furniture.

The driver 25 includes testing circuitry 27, described further below. The combination of driver 25 and OLED module may change throughout the lifetime of an OLED, whereas the combination of an OLED and its associated PCB will not.

The printed circuit board 20 has a bottom metallisation layer which includes pads for connecting to the anode and cathode regions 12a, 12c. Conductive glue can be used to bond these pads to the cathode and anode contact regions of the connection layer. The PCB has a second metallisation layer for providing interconnects between the anode regions and between the cathode regions. It might comprise even more layers in case more complex contacting structures are used, for example as may be required for colour-tuneable devices. Thus, the PCB comprises at least two conducting layers. Vias are used to connect between the layers at desired locations.

The second layer can be at the top or within the PCB structure.

In one embodiment, the PCB has a frame shape mounted over the outer ledge 16. In addition to interconnecting the cathode and anode regions, it provides the external contacts for electrical connection of the driver to the OLED as shown in FIG. 2. Other shapes of the PCB can be used, or a number of smaller more local PCBs can be used to contact the cathode/anode layers if the device design allows for it.

FIG. 2 shows a light diffusing foil 24 at the light output face of the OLED package. This may or may not be desired depending on the lighting application.

The invention makes use of the contact face between the PCB 20 and the contact layer 12 over the substrate 10 to provide encoding of the characteristics of the OLED.

Figure 3:
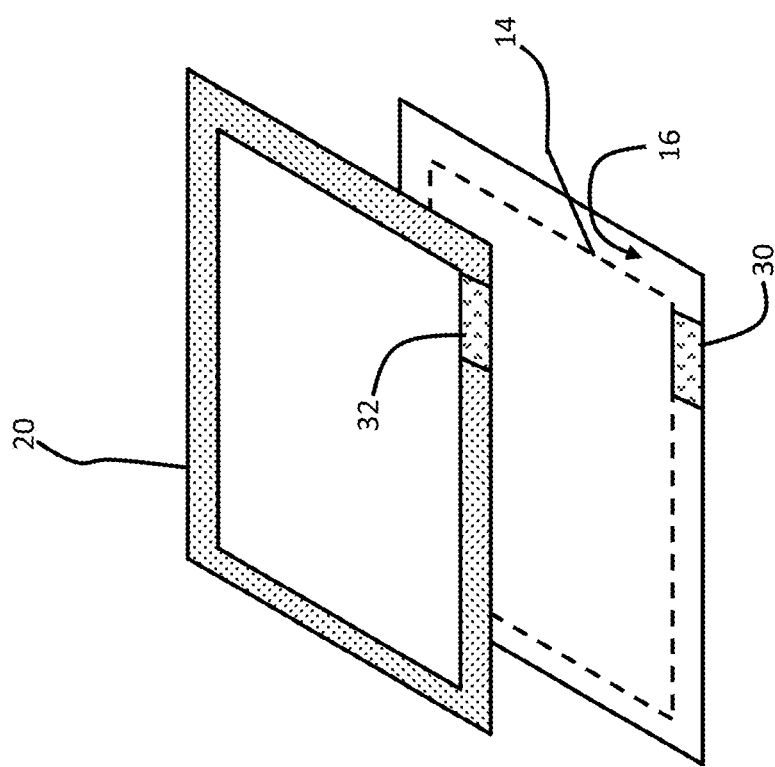
FIG. 3 shows a first example of a substrate and PCB of an LED arrangement in accordance with the invention, in schematic form.

The principle is illustrated and simplified in FIG. 3.

The ledge 16 of the OLED substrate is provided with a pattern 30 of contact pads. These contact pads have an interconnection pattern which encodes information about the characteristics of the OLED.

The PCB 20 has a corresponding readout region 32 for testing the connections between the contact pads. This testing essentially involves determining if a pair of contacts is open circuit or short circuit. Simple voltage driving and current detection can be used for this purpose. Software can then be used to set the driver electronics to the appropriate mode. The driver electronics then has firmware or microprocessor controlled parameters, which are controlled in dependence on the connection pattern.

In this way, a dedicated area of the substrate (or multiple areas) is used to create open circuits or short circuits between selected read out pads in the PCB 20 when glued onto the OLED substrate.

FIG. 4 shows a most simple implementation.

Figure 4B:
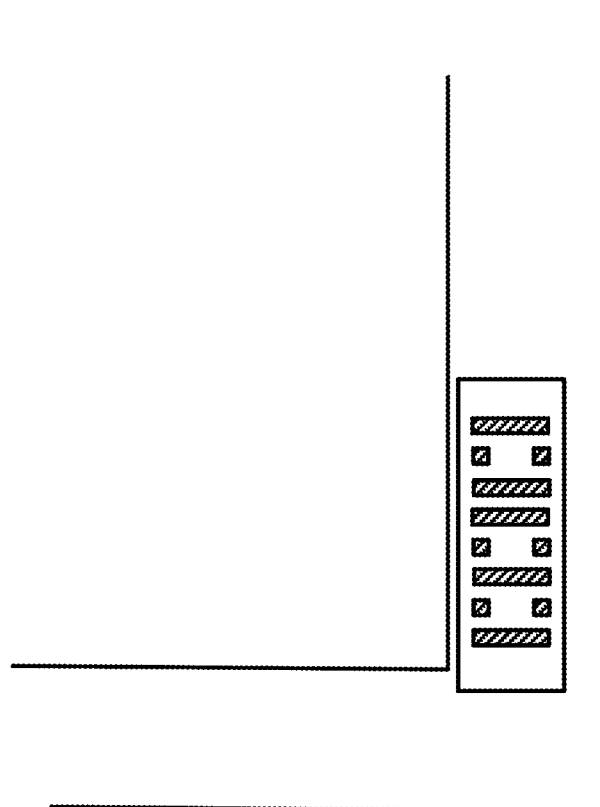
FIG. 4 shows how the contact pad connections are formed.
Figure 4A:
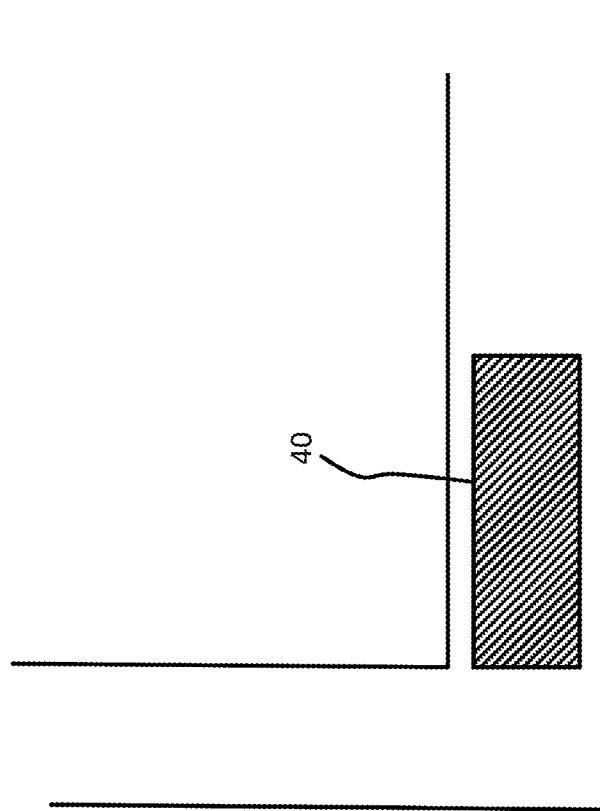

FIG. 4a shows a region 40 of conductive material, at the location where the PCB contact pads are to be provided. The substrate glass is manufactured providing a full area coating of ITO or other conductive material within this region. This region is patterned (i.e. locally removed) by suitable processes such as laser ablation so that a pattern is formed which can be used to provide separation of the previous conductive connection between selected contact pads on the PCB. Thus, shorted connections are removed. The region of conductive material defines a default setting, so that a single substrate design is used. By providing patterning post-manufacture, data can be encoded into the pattern. For example, FIG. 4b shows a pattern of interconnections formed by patterning the region of conductive material. The completed pattern comprises pairs of contact pads, some of which are interconnected and others are isolated. If an interconnected pair encodes a 1 and a broken connection encodes a 0, it can be seen that the pattern of FIG. 4b encodes 10101101.

Of course, where no connection is to be formed between two pads, there is no need for any conducting material at all. The term "contact region" should be understood accordingly as an area to which contact is made by the PCB. It may or may not have conducting material. Thus, the non-connected regions shown in FIG. 4(b) may have no metal layer present at all.

The pairs can be aligned end-to-end instead of in parallel, so that a single row is needed. This enables the ledge width to be kept as small as possible.

By increasing the number of contact pads, and/or the number of locations where read out is provided (for example at multiple corners), the amount of encoded data can be increased. With the trend for large area lighting panels, there is no shortage of substrate area.

More complex encoding can be used. For example, a grid of pads can be used, and the full interconnection network can be established. This enables fewer pads to encode the same amount of information. For example 4 pads in a square can encode two bits, if arranged as two pairs, 4 pads can however encode 16 different network patterns (using only non-diagonal connections between pads) and therefore 4 bits.

For the example of LED devices, there is a desire to reduce the width of the non-light-emitting frame as much as possible. The typical width of a PCB strip is currently typically of the order of magnitude of a few mm, for example 2 to 4 mm. Hence, if multiple row patterns are to be used then dot sizes are limited to about 1×1 mm$^2$. The lateral dimensions of OLEDs are increasing, hence the strip length that can be used to encode data is increasing as well. This means that even a single dot-row can be used. From the manufacturing perspective, to facilitate alignment and gluing, it may be desired to maintain the contact pad size at around 2×2 mm² for a single dot and also the distance between dots should be of the same order of magnitude.

The patterning approach shown in FIG. 4 starts from a generic substrate design with areas reserved to later on provide the encoding but not yet patterned (FIG. 4(a)). The substrate electrode material can then be ablated by a flexible scanning laser patterning process or the like after the OLED has been prepared, and just prior to attaching the PCB. The relevant ablation data can be generated from the current job data of the manufacturing line, so that the current OLED characteristics are known.

The processing of the electrode material layer can also be combined with existing steps of the process, for example combined with the process used to pattern the thin film encapsulation.

The PCB has a corresponding set of read-out pads at the relevant positions to interconnect with the coded areas on the substrate. In this way, a single PCB design and a single substrate design can be used to fabricate different devices with varying architectures while giving the possibility for the driver to detect the characteristics of the individual OLED stack.

As explained above, the main purpose is to provide driving data for the OLED to the driver. However, the coding can also be used to code other data, such as production data, type names, job names, etc.

Because the code is provided as one of the latest steps in the production sequence, it can also be used to define driving parameters in addition to the identification code of the architecture. This could be used for example to deliberately set a certain new device to a luminance level comparable to devices of the same type but already being used for a while. This means that a new OLED can be driven in a way which simulates ageing in order to match other OLEDs of the overall luminaire. This enables the integration of new devices into an existing installation/luminaire comprising older devices as well without appearing visually different.

The PCB functions as an interface between the OLED substrate and the driver. For this purpose, the PCB can route each PCB contact pad to an I/O port which connects to a wire of the strip 26 (FIG. 2). The driver then has a direct interconnection to each PCB contact pad. It might be a disadvantage that several wires are then required; one for each contact pad and also power wires for the device to be operated. The PCB can therefore include logic to compress or multiplex the binary data so that fewer wires are required to transmit the encoded information to the driver. Of course, there is a trade off between the number of components on the PCB and the number of I/O ports needed.

The number of required wires depends on the range of functionality of the device that is to be controlled. At present, for OLED devices, this control is generally limited to brightness control, and there is a small range of different shapes and dimensions. Thus, no such compression/multiplexing may be required, but it may be of interest for a greater required amount of data transfer to the driver.

The example above makes use of the substrate anode layer to form the interconnection pattern, and for a bottom emitting device. However, the contact pattern does not need to be formed in the anode layer itself. Additional layers, such as a metal support frame on top of the anode material can be used. A typical material for electrical support structures on ITO is MAM (Molybdenum-Aluminium-Molybdenum) with some component of Nd and Nb to make the layer system more stable against corrosion. The PCB can then be glued to the metal support frame.

The general layout of a device using this approach can be no different to FIG. 1, although it may need less cathode contacts.

However, the need for a PCB frame can also be avoided as mechanical support is then realized (at least partially) by the additional metal frame. Typically there is either only a frame of metal around the device (e.g. the rim depicted in FIG. 3) or else a metal frame can have an additional mesh or grid extending inside the emitting area. The PCB can then be provided as a smaller unit or a set of smaller units.

The invention can also be applied to a backside-contacted OLED. The most promising feature of backside-contacted OLEDs is that the non-illuminating area surrounding frame can be omitted, so that light sources can be placed adjacent each other to form a continuous lighting area.

FIG. 5 shows an OLED structure 50 over a substrate 10, with the PCB 52 with read out pads over the back of the OLED structure. There is a localized area on the back of the OLED which comprises a pattern structure to interface with the PCB.

When contacting to the back side, the main difference is the material on the surface. For example, either MAM or a transparent conductive oxide is used for the back side contact The PCB 52 of FIG. 5 has the same contact pad features as described above but there is no current distribution function. The PCB provides contacts to power the OLED and it has the patterned read-out area. A specially prepared area of the back side is used to form the pattern of conducting or non-conducting regions that are connected to the PCB contact pads. The PCB does not have to cover the whole area of the lighting unit as shown in FIG. 5.

There are various ways to implement the network of conducting and non-conducting pads in this example. Some possibilities are:

locally printing conductive ink into the desired patterns;

using a conductive back side heat spreading/dissipation foil or metal plate which is patterned locally to prevent conductivity; or printing an insulating lacquer locally, hence locally preventing electrical contact between selected contact pads of the PCB and the backside metal foil.

There are of course other ways to realize a specific network of connected and non-connected pads. Different printing techniques, such as ink jet printing, slit coating, or lithographic processes can be used.

The device description encoded in the pattern can be placed very late in the production process and in a flexible manner, related to the manufacturing job.

The examples above make use of the PCB for readout of data as well as for providing power supply to the OLED and/or for improving contact conductivity. However, a different technology can be used to provide electrical contacts to power the OLED, with a separate local PCB applied to provide the read out function.

The examples above show a single patterned region of the device substrate. However, there may be multiple regions, and this can prevent high current injection (to perform the testing of short circuits) into a small localised area of the substrate.

The examples above relate to LED lighting systems. However the invention can be applied to any device in which a driver and a device are manufactured separately, so that device and driver may evolve at different rates, thereby requiring compatibility between different drivers and devices. An example is solar panels, where the driver processes the generated electrical energy, but may need to know the characteristics of the connected solar panel.

Thus, the invention can be applied to all types of LED device, in particular OLED devices, as well as to other driven devices. It is of particular interest for general lighting applications and OLED based luminaires.

The use of the contact pads to encode a control word for use by the driver is only one approach. The pattern formed in the device substrate may for example be used to implement connections through to different parts of the driver circuit, rather than encoding a digital word. Thus, the use of the PCB and device contact pads may be more hardware based. The characteristics encoded by the network of device interconnections can then have an impact on the way the driver is physically connected to the device.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A device for connection to a device driver, comprising:
   a substrate;
   a patterned area of the substrate comprising a set of device contact regions, wherein a network of interconnections is provided between the device contact regions, which network encodes information concerning the characteristics of the device
   wherein the patterned area comprises a set of pairs of device contact regions, wherein a short between a pair encodes one binary value and an open circuit between a pair encodes an opposite binary value.

2. The device as claimed in claim 1, comprising an LED device, having a set of layers defining an active light emitting area of the device.

3. The device as claimed in claim 2, wherein the network encodes information concerning the desired driving voltage or a required dimming level.

4. The device as claimed in claim 2 wherein the patterned area of the substrate is at a peripheral part of the substrate.

5. The device as claimed in claim 3, wherein the patterned area of the substrate is at a peripheral part of the substrate.

6. The device as claimed in claim 1, wherein each device contact region has an area of at least 1 $mm^2$.

7. The device as claimed in claim 1 wherein an open circuit between a pair of device contact regions is formed as a pattern applied to previous short circuit.

8. The device as claimed in claim 6, wherein an open circuit between a pair of device contact regions is formed as a pattern applied to previous short circuit.

9. The device as claimed in claim 1, further comprising a PCB which connects to the patterned area of the substrate, the PCB having a set of PCB contact pads for connection to the device contact regions.

10. An electronic apparatus comprising:
    the device as claimed in claim 8; and
    a driver comprising a connection part for interfacing with the PCB of the device, wherein the driver comprises: testing circuitry for testing short circuits or open circuits between the PCB contact pads, thereby to enable the network of interconnections between the device contact regions to be determined caused by the connection of the PCB contact pads to the device contact regions.

11. The apparatus as claimed in claim 9, comprising an LED lighting apparatus and wherein the device comprises an LED device.

12. The LED lighting apparatus as claimed in claim 10, wherein the driver is adapted to drive the LED device in dependence on the information concerning the characteristics of the LED device as determined by the testing circuitry.

13. A method of driving a device, comprising:
    testing for interconnections between a set of device contact regions on a substrate of the device, thereby to determine a network of interconnections provided between the device contact regions, which network encodes information concerning the characteristics of the device; and
    driving the device using a driver which is controlled in dependence on the encoded information;
    wherein the testing comprises connecting the device contact regions to contact pads of a PCB, and coupling the PCB to a device driver.

14. The method as claimed in claim 13 wherein the device comprises an LED device.

15. The method as claimed in claim 14, wherein the network encodes information concerning the desired driving voltage or a required dimming level.

16. The method as claimed in claim 13, wherein the device comprises an LED device.

* * * * *